(12) United States Patent
Fujino

(10) Patent No.: US 6,368,401 B1
(45) Date of Patent: Apr. 9, 2002

(54) METHOD OF PRODUCING MAGNETIC GARNET SINGLE CRYSTAL FILM AND MAGNETIC GARNET SINGLE CRYSTAL FILM HAVING A NONUNIFORM THICKNESS

(75) Inventor: Masaru Fujino, Otsu (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/588,511

(22) Filed: Jun. 6, 2000

(30) Foreign Application Priority Data

Jun. 16, 1999 (JP) .......................... 11-170000

(51) Int. Cl.$^7$ .......................... C30B 19/02
(52) U.S. Cl. .......................... 117/64; 117/945
(58) Field of Search .......................... 117/36, 64, 67, 117/945, 54, 58, 59

(56) References Cited

U.S. PATENT DOCUMENTS

| | | | | |
|---|---|---|---|---|
| 4,077,832 A | * | 3/1978 | Robertson et al. | 156/624 |
| 4,200,484 A | * | 4/1980 | Glass | 156/622 |
| 4,293,371 A | * | 10/1981 | Kokta et al. | 156/624 |
| 4,354,254 A | * | 10/1982 | Blank et al. | 365/33 |
| 4,400,445 A | * | 8/1983 | Berkstresser | 428/700 |
| 4,647,514 A | * | 3/1987 | Le Craw et al. | 428/692 |
| 4,690,726 A | * | 9/1987 | Luther et al. | 156/624 |
| 4,755,026 A | * | 7/1988 | Honda et al. | 350/376 |
| 5,277,845 A | * | 1/1994 | Ryuo et al. | 252/584 |
| 5,449,942 A | * | 9/1995 | Tanno et al. | 257/421 |
| 5,616,176 A | * | 4/1997 | Fukuda et al. | 117/54 |
| 5,683,506 A | * | 11/1997 | Shirai et al. | 117/54 |
| 5,898,516 A | * | 4/1999 | Shirai et al. | 359/324 |
| 6,031,654 A | * | 2/2000 | Hiramatsu et al. | 359/280 |
| 6,059,878 A | * | 5/2000 | Takeda et al. | 117/56 |

\* cited by examiner

Primary Examiner—Benjamin L. Utech
Assistant Examiner—Matthew Anderson
(74) Attorney, Agent, or Firm—Ostrolenk, Faber, Gerb & Soffen, LLP

(57) ABSTRACT

A method of producing a magnetic garnet single crystal film by a liquid phase epitaxial process, comprises the steps of: forming a platinum or platinum alloy film in any desired shape having any desired thickness on a nonmagnetic garnet single crystal substrate; and bringing the nonmagnetic garnet single crystal substrate into contact with a magnetic garnet raw material melt containing lead oxide as a flux to grow a magnetic garnet single crystal film on the nonmagnetic garnet single crystal substrate while removing the platinum or platinum alloy from the nonmagnetic garnet single crystal substrate with the flux.

12 Claims, 4 Drawing Sheets

METHOD OF PRODUCING MAGNETIC GARNET SINGLE CRYSTAL FILM AND MAGNETIC GARNET SINGLE CRYSTAL FILM HAVING A NONUNIFORM THICKNESS

BACKGROUND OF THE INVENTION

1. Field of the Invention

The present invention relates to a method of producing a magnetic garnet single crystal film.

2. Description of the Related Art

Conventionally, magnetic garnet single crystal films are widely used for magnetostatic wave devices such as a delay line filter, an oscillator, a nonlinear device, and the like, and for magnetooptical devices such as an optical isolator using a Faraday rotation effect, a circulator, and the like. As a main method of producing such magnetic garnet single crystal films, a liquid phase epitaxial growth process (LPE process) is known.

The liquid phase epitaxial growth process for producing a magnetic garnet single crystal film comprises, for example, filling a platinum crucible maintained in a heating furnace with oxides of constituent elements of garnet and PbO and $B_2O_3$ as a flux, and homogenizing at about 1200° C. to form a melt. Next, the melt is maintained in a supercooled state, i.e., at a temperature (about 900° C.) below and near the liquid line, and, for example, a $Gd_3Ga_5O_{12}$ (referred to as "GGG" hereinafter) substrate as a base substrate is then immersed in the melt, followed by epitaxial growth for a predetermined time to grow a magnetic garnet single crystal film on a surface of the base material.

In order to process a surface of a magnetic garnet single crystal film or remove unnecessary magnetic garnet single crystal film from the base substrate in the process for manufacturing a device such as an optical isolator or the like, a method is conventionally used in which the garnet single crystal film is mechanically processed or a protecting film of polyimide or the like is formed, and then a portion of the magnetic garnet single crystal film, which has no protecting film, is removed by etching with hot phosphoric acid.

However, the conventional method of mechanically processing or removing by etching has a problem in that it is difficult to control the thickness. In the etching method, the nonmagnetic garnet substrate used as the base substrate is also etched to cause variation in the thickness of the base material, thereby causing a problem in that it is difficult to design a device utilizing a dielectric material of a base material.

SUMMARY OF THE INVENTION

In view of the foregoing, the present invention provides a method of producing a magnetic garnet single crystal film which is capable of growing a magnetic garnet single crystal film and, at the same time, providing the grown magnetic garnet single crystal film with any desired shape and thickness. The present invention also provides a magnetic garnet single crystal film grown on a surface of a substrate which has a nonuniform thickness immediately after film growth.

In order to achieve the objects, a method of producing a magnetic garnet single crystal film by the liquid phase epitaxial process, comprises the steps of: forming a platinum or platinum alloy film in any desired shape having any desired thickness on a nonmagnetic garnet single crystal substrate; and bringing the nonmagnetic garnet single crystal substrate into contact with a magnetic garnet raw material melt containing lead oxide as a flux to grow the magnetic garnet single crystal film on the nonmagnetic garnet single crystal substrate while removing the platinum or platinum alloy from the nonmagnetic garnet single crystal substrate with the flux.

A magnetic garnet single crystal film of the present invention is grown on a nonmagnetic garnet single crystal substrate while removing platinum or platinum alloy previously formed on the nonmagnetic garnet single crystal substrate, allows the thickness of the magnetic garnet single crystal substrate to be nonuniform on a surface of the nonmagnetic garnet single crystal substrate, if desired.

As seen from the above description, the method of producing magnetic garnet of the present invention can grow a magnetic garnet single crystal film, and at the same time, provide the grown magnetic garnet single crystal film with any desired shape and thickness. A magnetic garnet single crystal film grown to nonuniform thickness on a surface of a substrate can be obtained. The production method can eliminate the etching process for removing a magnetic garnet single crystal film after growth.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
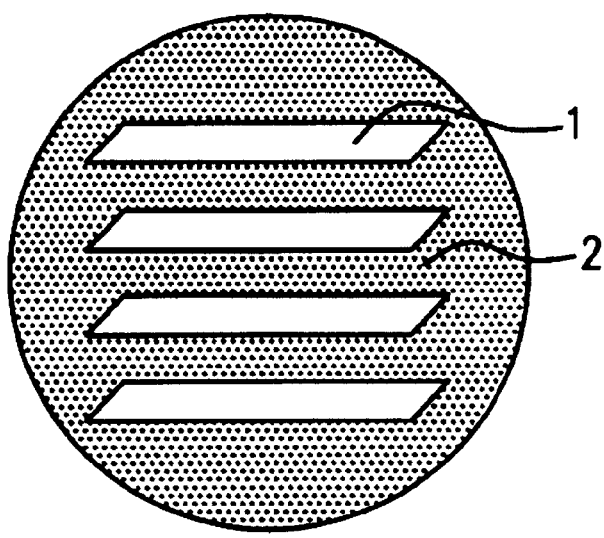
FIG. 1 is a plan view of a GGG substrate showing a platinum film pattern in Example 1 of the present invention.

One of the features of the present invention is that the novel method for producing magnetic garnet film employs a platinum film or a platinum alloy film as a mask for growing a magnetic garnet single crystal film, based on the finding that platinum or alloy containing platinum as a main component is gradually dissolved in a magnetic garnet raw material melt. Although the mechanism of dissolving platinum has not been fully understood, it is believed that platinum is oxidized by lead oxide used as flux in the magnetic garnet raw material melt, and platinum oxide is dissolved into the raw material melt, reduced lead and platinum forming an alloy to be dissolved into the raw material melt.

According to the method of the present invention, platinum film having a desired opening pattern is formed on a non-magnetic garnet single crystal substrate. When a magnetic garnet film is grown on the substrate while contacting the non-magnetic garnet single crystal substrate with a magnetic garnet raw material melt, a magnetic garnet single crystal film is grown in the opening pattern. The magnetic garnet single crystal film is not formed on the platinum film. During the growth of the magnetic garnet film, the thickness of the platinum film is gradually reduced, and the platinum film is then dissolved and disappears. If the growth of the magnetic garnet film is stopped at this time, the magnetic garnet single crystal film is formed only in the region of the opening pattern on the substrate, and the platinum film is removed so that the remaining portion of the substrate is now exposed. That is, the platinum film is removed at the same time the growth of the magnetic garnet single crystal film is finished.

The thickness of magnetic garnet single crystal film to be formed is controlled by adjusting the thickness of the platinum film used as a mask. For example, in the case where the growth rate of the magnetic garnet single crystal film and the dissolving rate of platinum film to the magnetic garnet raw material melt are set at a nm/min and b nm/min respectively, in order to form a magnetic garnet single crystal film having a thickness of X nm, a platinum film having a thickness of X·(b/a) nm is formed.

It is not necessary to stop growing the magnetic garnet single crystal at the time the platinum film has just disappeared. In the case where the platinum film may be left on the substrate, the growth of the magnetic garnet film can be stopped before the platinum film disappears. Alternatively, in the case where a thin magnetic garnet single crystal film may be formed around the desired pattern, the growth of the magnetic garnet film can be stopped at an appropriate time after the platinum film disappears.

In the case where the growth of the magnetic garnet single crystal film is continued even after the platinum film is removed, the region on which the platinum film was formed is regarded as a region on which the growth of the magnetic garnet single crystal film begins starts at the platinum film disappears. Since the start timing of the crystal growth can be controlled by changing the thickness of the platinum film, it is possible to grow a magnetic garnet single crystal film having different thicknesses within the film at once.

Hereinafter, the preferred embodiments of the present invention are explained in detail with reference to the drawings.

A method of producing a magnetic garnet single crystal film in accordance with an embodiment of the present invention will be described below on the basis of examples.

EXAMPLE 1

Referring to FIGS. 1, 2, 3 and 4, a GGG substrate 1 having a diameter of 25 mm was first prepared as a nonmagnetic garnet single crystal substrate as a base substrate. Then, a platinum film 2 was deposited to a thickness of 3 μm in the shape shown in FIG. 1 on a main surface of the GGG substrate 1 by a vacuum evaporation process.

Next, iron oxide ($Fe_2O_3$) and yttrium oxide ($Y_2O_3$) with a purity of 99.99% as raw materials for $Y_3Fe_5O_{12}$ (abbreviated to "YIG" hereinafter) of a magnetic garnet single crystal film, and boron oxide ($B_2O_3$) and lead oxide (PbO) as fluxes were weighed and mixed at ratios of 7.5, 0.5, 2.0, and 90.0 wt %, respectively, so that the total amount was 800 g, and then a platinum crucible having a diameter of 60 mm and a height of 60 mm and maintained in a vertical electric furnace was filled with the resultant mixture, followed by homogenization at 1200° C. to form a melt.

Figure 2:
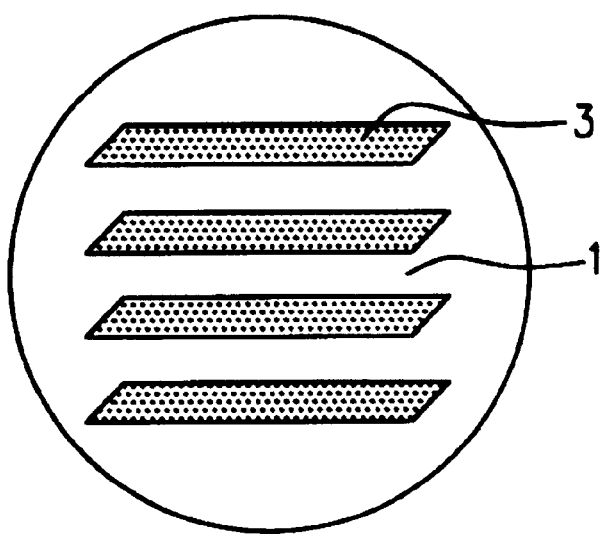
FIG. 2 is a plan view of a GGG substrate showing a YIG single crystal film pattern in Example 1 of the present invention.

Next, the melt was maintained at a constant temperature of 910° C. to bring the melt into a supersaturation state, and then the GGG substrate 1 on which the platinum film 2 was previously deposited was immersed in the melt so that a YIG single crystal was grown for 20 minutes while the substrate 1 was rotated at 100 rpm. Then, the substrate 1 was pulled up from the melt, and rotated at 500 rpm to fling off the melt adhering to the YIG single crystal by centrifugal force, to product a YIG single crystal film 3. The thus-obtained YIG single crystal film 3 was not formed on portions to which platinum was previously deposited, as shown in FIG. 2, and thus the previously formed platinum film was not removed by the fluxes.

Figure 3:
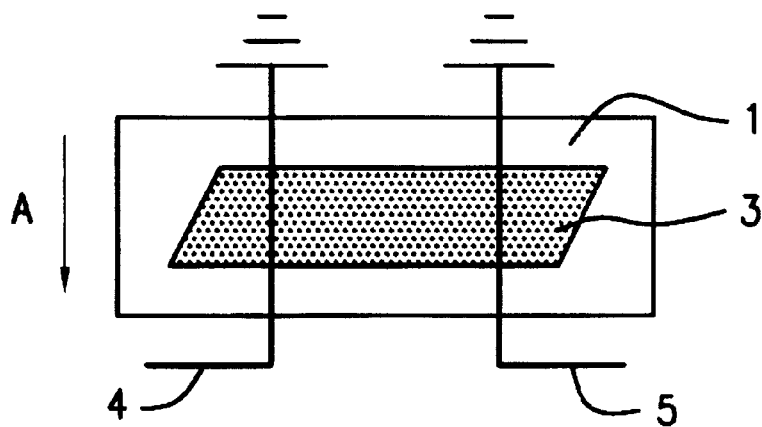
FIG. 3 is a plan view showing a magnetostatic wave device related to Example 1 and Comparative Example of the present invention.
Figure 4:
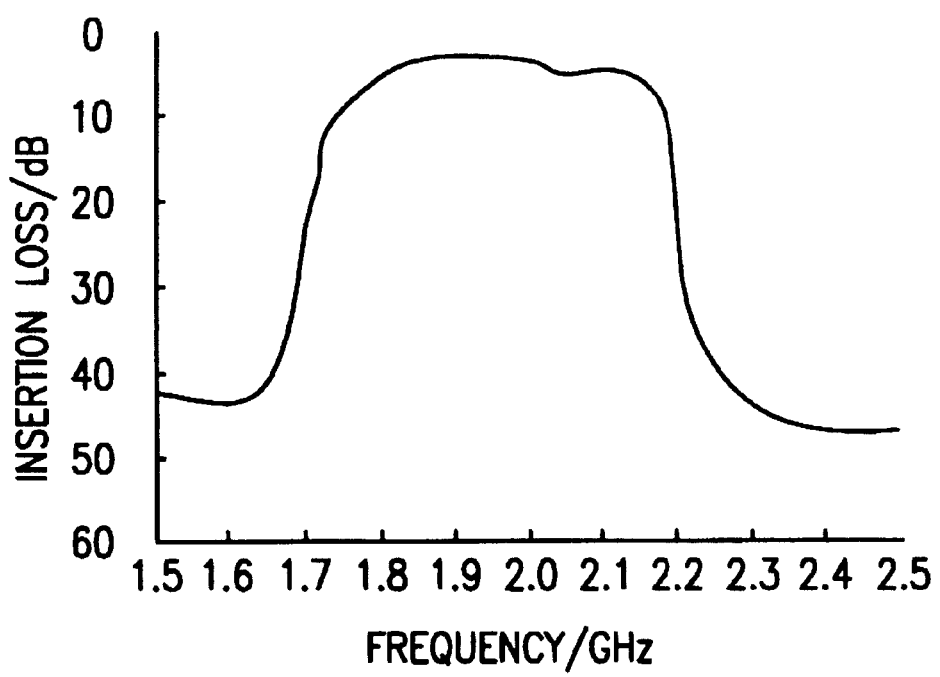
FIG. 4 is a chart showing microwave transmission characteristics of a magnetostatic wave device related to Example 1.
Figure 5:
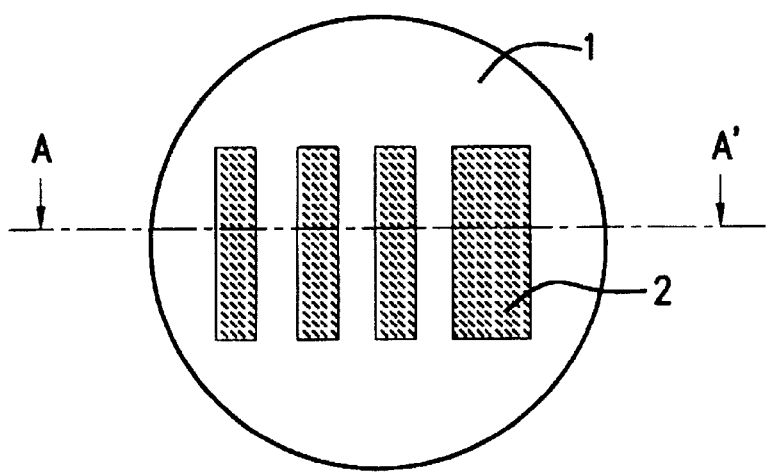
FIG. 5 a plan view of a GGG substrate showing a platinum
Figure 6:
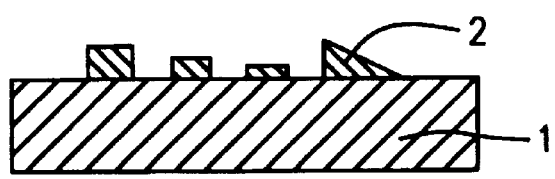
FIG. 6 is a sectional view of the GGG substrate shown in FIG. 5 taken along line A–A'.

The GGG substrate 1 on which the YIG single crystal film 3 was formed was then cut into chips by a dicing saw to form the magnetostatic wave device shown in FIG. 3, and an external magnetic field of 12 mT was applied in parallel to the YIG single crystal film to measure transmission of microwaves of 1.5 to 2.5 GHz. As a result, good transmission characteristics with less insertion loss were obtained, as shown in FIG. 4. In FIG. 3, reference numeral 4 denotes an input terminal, reference numeral 5 denotes an output terminal, and reference character A denotes the application direction of the external magnetic field.

EXAMPLE 2

Referring to FIGS. 5, 6, 7 and 8, a GGG substrate 1 having a diameter of 25 mm was prepared as a nonmagnetic garnet single crystal substrate as a base substrate. Then, a platinum film 2 was deposited in the shapes having the thicknesses shown in FIGS. 5 and 6 on a main surface of the GGG substrate 1 by a vacuum evaporation process.

Next, iron oxide ($Fe_2O_3$) and yttrium oxide ($Y_2O_3$) with a purity of 99.99% as raw materials for $Y_3Fe_5O_{12}$ (abbreviated to "YIG" hereinafter) of a magnetic garnet single crystal film, and boron oxide ($B_2O_3$) and lead oxide (PbO) as fluxes were weighed and mixed at ratios of 7.5, 0.5, 2.0, and 90.0 wt %, respectively, so that the total amount was 800 g, and then a platinum crucible having a diameter of 60 mm and a height of 60 mm and maintained in a vertical electric furnace was filled with the resultant mixture, followed by homogenization at 1200° C. to form a melt.

Next, the melt was maintained at a constant temperature of 910° C. to bring the melt into a supersaturation state, and then the GGG substrate 1 on which the platinum film 2 was previously deposited was immersed in the melt so that a YIG single crystal was grown for 20 minutes while the substrate 1 was rotated at 100 rpm. Then, the substrate 1 was pulled up from the melt, and rotated at 500 rpm to fling off the melt adhering to the YIG single crystal by centrifugal force, to produce a YIG single crystal film 3.

Figure 7:
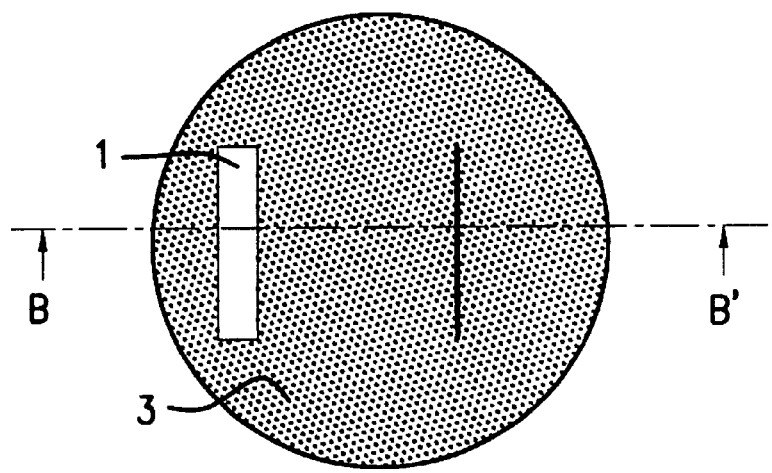
FIG. 7 a plan view of a GGG substrate showing a YIG single crystal film pattern in Example 2 of the present invention.
Figure 8:
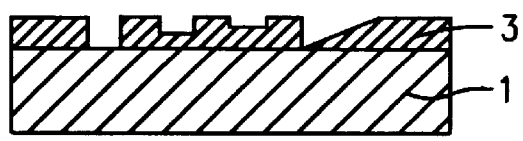
FIG. 8 is a sectional view of the GGG substrate shown in FIG. 7 taken along line B–B'.

The deposited platinum was removed with the fluxes, and the thusobtained YIG single crystal film was a single crystal film having a thickness distribution as shown in FIGS. 7 and 8.

COMPARATIVE EXAMPLE

Figure 9:
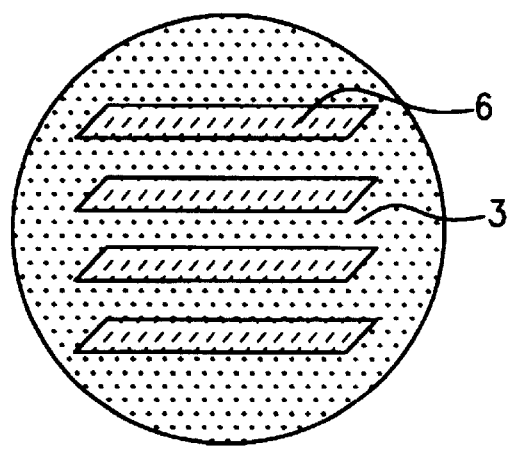
FIG. 9 a plan view of a GGG substrate showing a polyimide film pattern formed on a YIG single crystal film in Comparative Example of the present invention.
Figure 10:
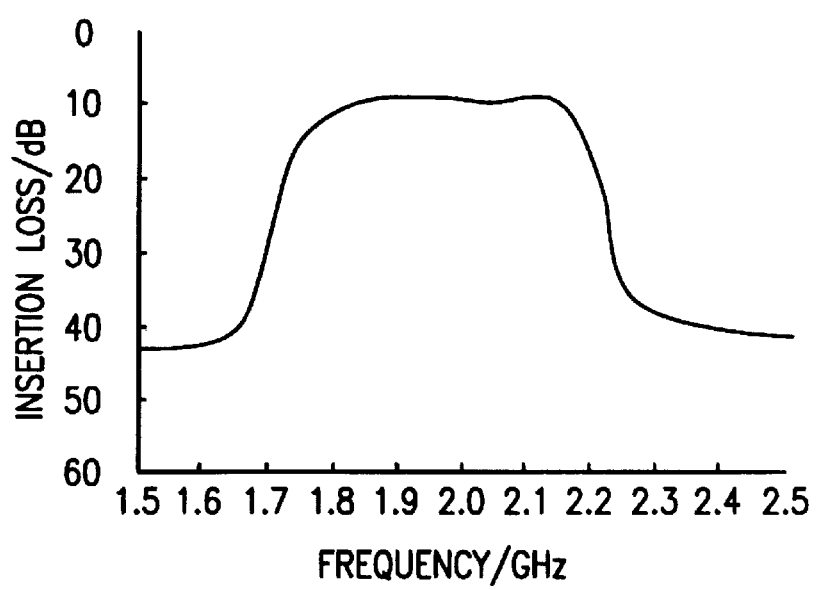
FIG. 10 is a chart showing microwave transmission characteristics of a magnetostatic wave device related to Comparative Example.

Referring to FIGS. 9 and 10, a GGG substrate 1 having a diameter of 25 mm was prepared as a nonmagnetic garnet single crystal substrate as a base substrate.

Like in Example 1, iron oxide ($Fe_2O_3$) and yttrium oxide ($Y_2O_3$) with a purity of 99.99% as raw materials for $Y_3Fe_5O_{12}$ (abbreviated to "YIG" hereinafter) of a magnetic garnet single crystal film, and boron oxide ($B_2O_3$) and lead oxide (PbO) as fluxes were next weighed and mixed at ratios of 7.5, 0.5, 2.0, and 90.0 wt %, respectively, so that the total amount was 800 g, and then a platinum crucible having a diameter of 60 mm and a height of 60 mm and maintained in a vertical electric furnace was filled with the resultant mixture, followed by homogenization at 1200° C. to form a melt.

Like in Example 1, the melt was maintained at a constant temperature of 910° C. to bring the melt into a supersaturation state, and then the GGG substrate 1 on which the platinum film 2 was previously deposited was immersed in the melt so that a YIG single crystal was grown for 20 minutes while the substrate 1 was rotated at 100 rpm. Then, the substrate 1 was pulled up from the melt, and rotated at 500 rpm to fling off the melt adhering to the YIG single crystal by centrifugal force, to produce a YIG single crystal film 3.

Next, the pattern shown in FIG. 9 was formed on the thus-obtained YIG single crystal film 3 by using a polyimide film 6. Then, the YIG single crystal film 3 was removed from portions without the polyimide film 6 with hot phosphoric acid at 210° C., and the polyimide film was removed to form a YIG single crystal film pattern.

Like in Example 1, a magnetostatic wave device was next formed, and transmission of microwaves of 1.5 to 2.5 GHz was measured. The results are shown in FIG. 10.

Although, in each of the examples, the magnetic garnet single crystal film of YIG ($Y_3Fe_5O_{12}$) has been described, the present invention is not limited to YIG. For example, by using various magnetic garnet single crystal films in which Y of $Y_3Fe_5O_{12}$ is partially replaced with at least one of La, Bi, Gd and Lu, or Fe is partially replaced by at least one of Al, Ga, In and Sc, the same effect can be obtained.

Besides the GGG substrate, for example, a NGG ($Nd_3Ga_5O_{12}$) substrate, a SGG ($Nd_3Ga_5O_{12}$) substrate, and the like can be used as the nonmagnetic garnet single crystal substrate for growing the magnetic garnet single crystal film.

Although in each of the above examples, the platinum film was previously formed on the nonmagnetic garnet single crystal substrate, the present invention exhibits the same effect when a platinum alloy such as a platinum-rhodium alloy, a platinum-iridium alloy, or the like is used in place of platinum.

Comparison between Example 1 and Comparative Example indicates that the method of the present invention can grow a magnetic garnet single crystal film, and at the same time, provide the grown magnetic garnet single crystal film with any desired shape. Furthermore, in use for a magnetostatic wave device, the magnetic garnet single crystal film obtained exhibits excellent transmission characteristics with insertion loss equivalent to or lower than conventional single crystal films.

Example 2 reveals that the method of the present invention can form a magnetic garnet single crystal film having any desired nonuniform thickness, not a uniform thickness, on a surface of a nonmagnetic garnet single crystal substrate.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of producing a magnetic garnet single crystal film by a liquid phase epitaxial process, comprising the steps of:

provinding a nonmagnetic garnet single crystal substrate having a platinum or platinum alloy film thereon; and bringing the nonmagnetic garnet single crystal substrate into contact with a magnetic garnet raw material melt containing lead oxide as a flux to grow a magnetic garnet single crystal film on the nonmagnetic garnet single crystal substrate while removing the platinum or platinum alloy from the nonmagnetic garnet single crystal substrate with the flux.

2. The method of claim 1, wherein the film does not cover the entire surface of the substrate.

3. The method of claim 1, wherein the thickness of the film is not uniform.

4. The method of claim 1, including the step of forming a platinum or platinum alloy film in a desired shape and desired thickness on the nonmagnetic garnet single crystal substrate.

5. The method of claim 4, wherein the magnetic garnet single crystal film is $Y_3Fe_5O_{12}$ or $Y_3Fe_5O_{12}$ in which Y is partially replaced with at least one of La, Bi, Gd and Lu, or Fe is partially replaced by at least one of Al, Ga, In and Sc, or both Y and Fe are partially replaced.

6. The method of claim 5, wherein the substrate is $Gd_3Ga_5O_{12}$, $Nd_3Ga_5O_{12}$ or $Nd_3Ga_5O_{12}$.

7. The method of claim 6, wherein the film is Pt.

8. The method of claim 6, wherein the film is a Pt alloy.

9. The method of claim 4, wherein the film is Pt.

10. The method of claim 4, wherein the film is a Pt alloy.

11. The method of claim 1, wherein the film is Pt.

12. The method of claim 1, wherein the film is a Pt alloy.

* * * * *